United States Patent [19]
Collins et al.

[11] Patent Number: 5,392,018
[45] Date of Patent: Feb. 21, 1995

[54] ELECTRONICALLY TUNED MATCHING NETWORKS USING ADJUSTABLE INDUCTANCE ELEMENTS AND RESONANT TANK CIRCUITS

[75] Inventors: Kenneth S. Collins; John Trow; Craig A. Roderick; Jay D. Pinson, II, all of San Jose; Douglas A. Buchberger, II, Tracy; Robert P. Hartlage, Sunnyvale; Viktor Shel, Milpitas, all of Calif.

[73] Assignee: Applied Materials, Inc., Santa Clara, Calif.

[21] Appl. No.: 975,355

[22] Filed: Nov. 12, 1992

Related U.S. Application Data

[63] Continuation-in-part of Ser. No. 825,658, Jan. 23, 1992, Pat. No. 5,187,454, and a continuation-in-part of Ser. No. 722,340, Jan. 27, 1991.

[51] Int. Cl.⁶ .............................................. H01F 21/00
[52] U.S. Cl. ...................................... 336/155; 336/57; 336/84 C; 336/196
[58] Field of Search ............... 336/57, 84 C, 196, 208, 336/199, 155

[56] References Cited

U.S. PATENT DOCUMENTS

| | | | |
|---|---|---|---|
| 2,611,030 | 9/1952 | Sontheimer | 178/44 |
| 2,807,788 | 9/1957 | Ackerly et al. | 336/155 X |
| 2,884,632 | 4/1959 | Dewitz et al. | 343/850 |
| 2,946,030 | 7/1960 | Slade | 336/155 |
| 4,375,051 | 2/1983 | Theall | 333/17 M |
| 4,450,716 | 5/1984 | Lefaucheux et al. | 73/146.5 |
| 4,518,941 | 5/1985 | Harada | 336/69 |
| 4,621,242 | 11/1986 | Theall, Jr. et al. | 333/17 M |
| 4,904,972 | 2/1990 | Mori et al. | 336/55 |
| 4,951,009 | 8/1990 | Collins | 333/17.3 |
| 4,977,301 | 12/1990 | Machara et al. | 219/10.55 B |
| 5,065,118 | 11/1991 | Collins et al. | 333/33 |
| 5,187,454 | 2/1993 | Collins et al. | 333/17.3 |

FOREIGN PATENT DOCUMENTS 0552955  7/1993  European Pat. Off. .

Primary Examiner—Leo P. Picard
Assistant Examiner—L. Thomas
Attorney, Agent, or Firm—Eric L. Prahl

[57] ABSTRACT

The disclosure discusses impedance matching circuits based on parallel-resonant L-C tank circuits, and describes a low-loss design for an adjustable inductance element suitable for use in these parallel tank circuits. The application of an impedance matching circuit to a plasma process is also disclosed; in this context, a local impedance transformation circuit is used to improve power transfer to the plasma source antenna.

7 Claims, 6 Drawing Sheets

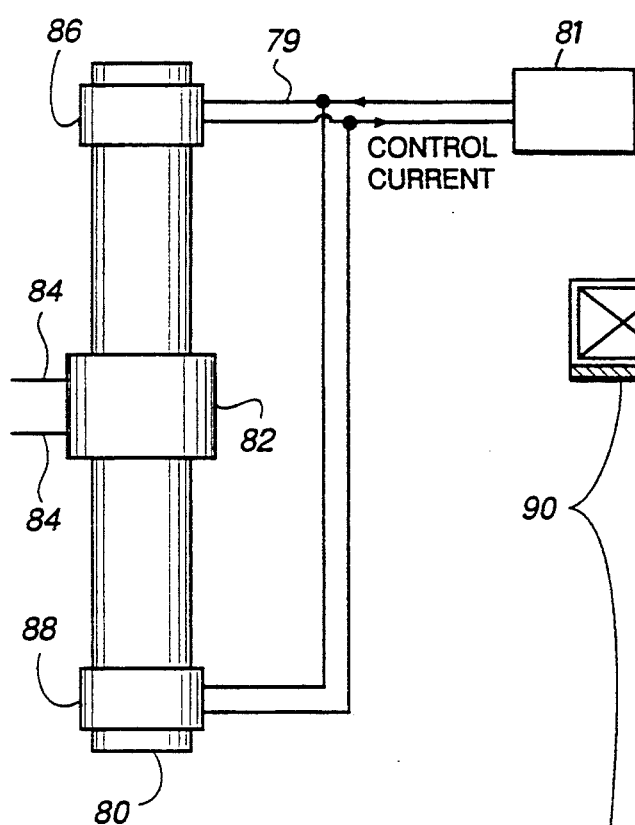
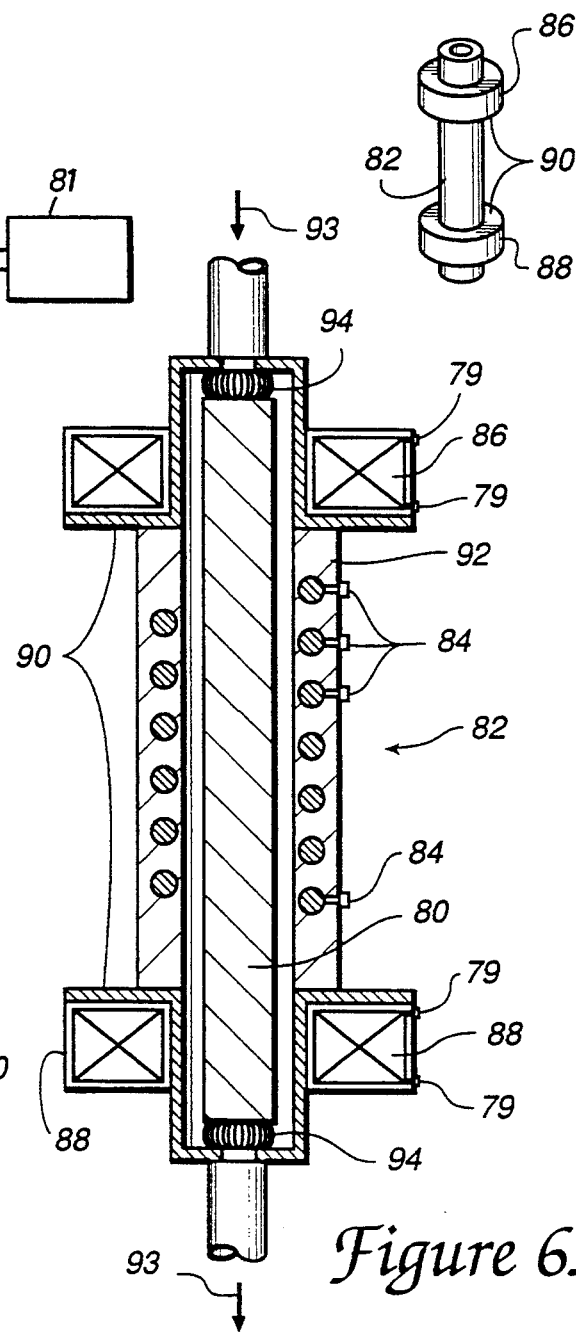
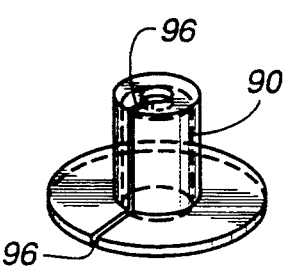

ELECTRONICALLY TUNED MATCHING NETWORKS USING ADJUSTABLE INDUCTANCE ELEMENTS AND RESONANT TANK CIRCUITS

CROSS REFERENCE TO RELATED APPLICATIONS

This application is a continuation-in-part of application Ser. No. 07/825,658, filed Jan. 23, 1992, now U.S. Pat. No. 5,187,454 by Kenneth S. Collins et al. for ELECTRONICALLY TUNED MATCHING NETWORK USING PREDICTOR-CORRECTOR CONTROL SYSTEM and a continuation-in-part of previously filed, co-pending application Ser. No. 07/722,340, filed Jan. 27, 1991, by Kenneth S. Collins et al. for PLASMA REACTOR USING ELECTROMAGNETIC RF COUPLING AND PROCESSES.

BACKGROUND OF THE INVENTION

This invention relates generally to impedance matching networks for matching a source impedance with a load impedance.

A common goal in connecting a source of electrical power to an electrical load is to maximize the power transfer from the source to the load. This goal is met when the output impedance of the source, or generator, is equal to the complex conjugate of the input impedance of the load.

By way of brief background, in alternating current (ac) circuits, impedance has a resistive component, referred to as the real component, and an inductive or capacitive component, referred to as the imaginary component. In conventional complex number notation, an impedance Z is given by $Z=R+jX$, where R is the real component, X is the imaginary component, and j is an operator equal to the square root of $-1$. Impedances are said to be complex conjugates when their resistive components are equal and their imaginary components are equal in magnitude but opposite in sign. If a generator impedance is $Z_G=R_G+jX_G$, then maximum power will be transferred to a load when the load impedance is $Z_L=R_G-jX_G$. Another way of thinking of complex conjugates is in terms of vector quantities. A simple resistive impedance may be thought of as a vector with a phase angle of zero. A complex impedance has a magnitude and a phase angle. Impedances that are complex conjugates of each other have equal magnitudes, but phase angles of equal magnitude and opposite sign.

In many circuit applications, the source or generator impedance does not match the load impedance, and an impedance matching network may be connected between the source and the load. Basically, the function of the impedance matching network is to present to the generator an impedance equal to the complex conjugate of the generator impedance, and to present to the load an impedance equal to the complex conjugate of the load impedance. The matching network contains a number of interconnected inductors and capacitors, some of which are adjustable in value to achieve the desired result.

U.S. Pat. Nos. 2,611,030, 4,375,051 and 4,621,242 disclose impedance matching circuits which use variable capacitance elements or a multi-tap transformer to adjust the impedance of matching circuits. The variable elements are adjusted by motors or solenoids. A disadvantage of these designs is that the adjustable elements are not solid state, and therefore will have reliability problems and a relatively slow response time.

U.S. Pat. Nos. 2,884,632 and 4,951,009 disclose impedance matching circuits in which the variable impedance element is an inductor comprising a primary winding on a toroidal core of magnetic material. The impedance of this inductor is adjusted by a low frequency current in a secondary winding on the toroid; this low frequency current generates a magnetic field which partially saturates the magnetic material, thereby altering the inductance seen at the primary winding. While this design allows solid state manufacture, it has the disadvantage that transformer coupling between the primary and secondary windings reflects parasitic impedances from the secondary winding into the primary winding, thereby altering the impedance of the primary winding away from the desired impedance and generating undesirable high-frequency resonances.

It will be appreciated from the foregoing that there is still a need for improvement in the field of dynamically adjustable impedance matching networks. The need is particularly acute in the field of plasma processing, as used in the fabrication of semiconductor circuitry. When the electrical load is a plasma, the load impedance is dynamic and nonlinear, and changes as more power is coupled to it, and as other variables, such as gas pressure and composition, are changed. Therefore, although the load impedance may be measured or estimated, for purposes of adjusting a matching network to optimize power transfer, the load impedance will change whenever the network values are adjusted. Accordingly, a dynamically adjustable network is essential for efficiently coupling power to a plasma. The present invention provides an effective alternative circuit design to those described in the forgoing U.S. Patents, which avoids the difficulties with the prior designs discussed above.

SUMMARY OF THE INVENTION

In one aspect, the invention features a variable inductance element comprising a signal coil wrapped around a gapped core of non-linear magnetic material. The magnetic permeability of the core is altered by low-frequency or DC magnetic fields generated in the core by current flowing in a control winding.

In preferred embodiments, the core is a cylindrical rod with the signal coil wound around the middle of the rod and the two control windings positioned at the ends of the rod and generating magnetic fields in the core in substantially the same direction. There is a cavity between the rod and the windings and coil which contains cooling liquid. Conductive shielding is positioned between the control winding and the core and coil to preventing high-frequency magnetic fields generated by the coil from coupling through the control winding, but permit low-frequency or DC magnetic fields generated by the control winding to couple through the coil. The conductive shielding is gapped to reduce eddy currents.

In another aspect, the invention features an impedance matching network for connection between an electrical signal generator and an electrical load. The network includes two tank circuits which comprise a variable inductor and a fixed capacitor. The first tank circuit is connected between the input of the network and ground, the second tank circuit is connected between the output of the network and ground, and a fixed impedance element is connected between the input and output of the network.

In preferred embodiments, the fixed impedance element is a inductor or a capacitor. The network is used to drive a plasma process via an electrically short source antenna or a bias electrode. The tank circuits are parallel LC tank circuits and comprise a capacitor in parallel or series with a variable inductor. The variable inductor can be as described in the preceding aspect. A local impedance transforming circuit such as that described in the following aspect, is coupled to the electrically short source antenna to allow improved power coupling between the network and the antenna.

In another aspect, the invention features a local impedance transforming network for connection to an electrically short antenna to allow improved power coupling between a transmission line connected to the antenna. The network comprises a first capacitor connected between a first terminal of the antenna and ground and a second capacitor connected between the second terminal of the antenna and ground.

In preferred embodiments, the source antenna drives a plasma process.

In another aspect, the invention features an impedance matching network for connection to an electrical load and an electrical signal generator. The network includes two tank circuits which comprise a variable inductor and a fixed capacitor. The signal generator output is connected to a first terminal of the electrical load and a first terminal of the first tank circuit; the second terminal of the first tank circuit is connected to ground. The second tank circuit is connected between a second terminal of the electrical load and ground.

BRIEF DESCRIPTION OF THE DRAWING

FIGS. 5 and 6A are diagrammatic and detail cross-sectional views of a current-controlled inductance used in the preferred embodiment of the invention.

FIG. 6B is a perspective view of the current-controlled inductance of FIG. 6A.

FIG. 6C is a perspective view of a conductive endpiece from the current controlled inductance of FIG. 6A.

As shown in the drawings for purposes of illustration, the present invention is concerned with impedance matching networks, for connection between a power generator and a load. In FIG. 1, an alternating current (ac) generator, indicated by reference numeral 10 is connected to an electrical load 12. One terminal of the generator and one terminal of the load are connected to ground, as indicated at 14o Maximum power transfer from the generator 10 to the load 12 occurs when the output impedance $Z_G$ of the generator, indicated at 16, is the complex conjugate of the impedance $Z_L$ of the load 12.

Figure 1:
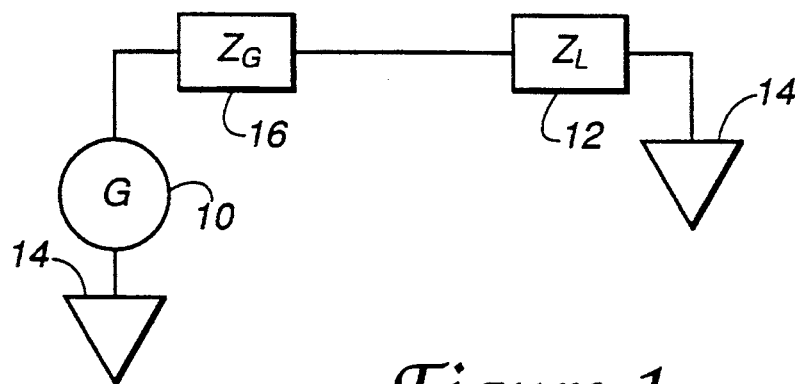
FIG. 1 is a block diagram showing a power generator driving a load.
Figure 2:
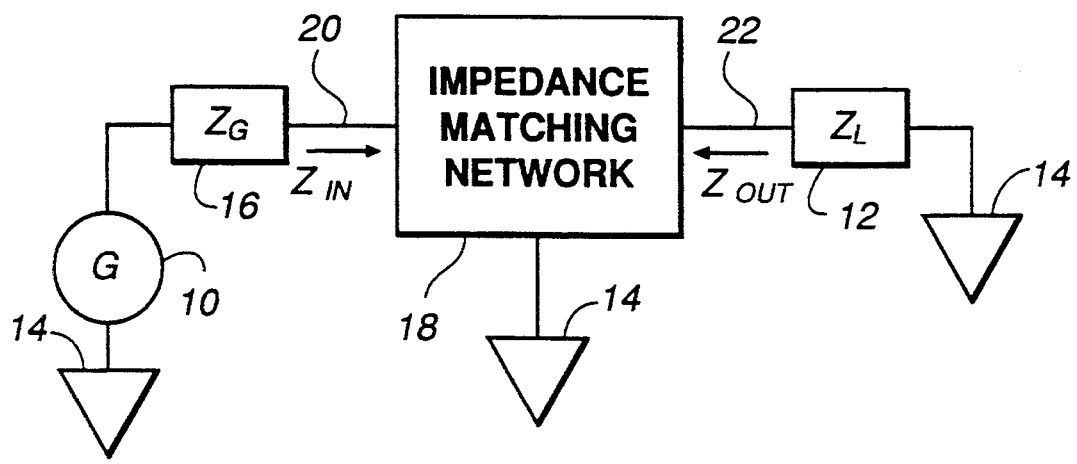
FIG. 2 is a block diagram showing a matching network connected between a power generator and a load.

Typically, generator and load impedances do not match exactly, and an impedance matching network 18 is installed between the generator 10 and the load 12, as shown in FIG. 2. Typically, the generator impedance 16 is purely resistive for most practical purposes, and is indicated in FIG. 2 as having a value $Z_G$. The input impedance of the network 18 with the load connected, as seen looking into the network on input line 20, is $Z_{IN}$, and the output impedance of the network, with the generator connected, as seen looking back into the network on output line 22, is $Z_{OUT}$. To maximize power transfer from the generator 10 to the load 12, $Z_{IN}$ is the complex conjugate of $Z_G$, and $Z_{OUT}$ is the complex conjugate of $Z_L$.

Previously-filed, copending U.S. patent application Ser. No. 07/825,658 discloses a control technique in which variable network values in the impedance matching network 18 are iteratively adjusted to converge on a solution based on values that are repeatedly predicted by a mathematical model of the network. As noted earlier, the typical situation involving impedance matching is one in which the generator or source impedance is fixed and the load impedance is unknown and may vary. In such a context, the task of impedance matching can be viewed as adjusting the network values until the input impedance $Z_{IN}$ matches the conjugate of the generator impedance $Z_G$.

Figure 3:
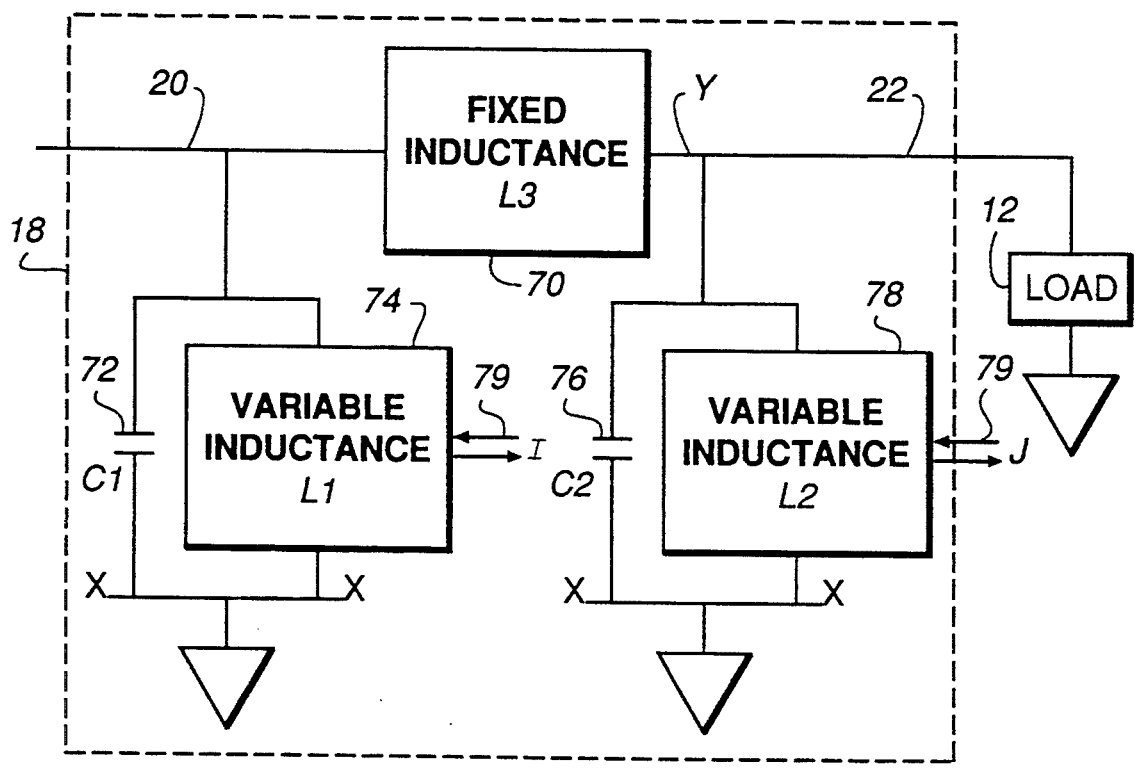
FIGS. 3 and 4 are block diagrams of illustrative matching network configurations.
Figure 4:
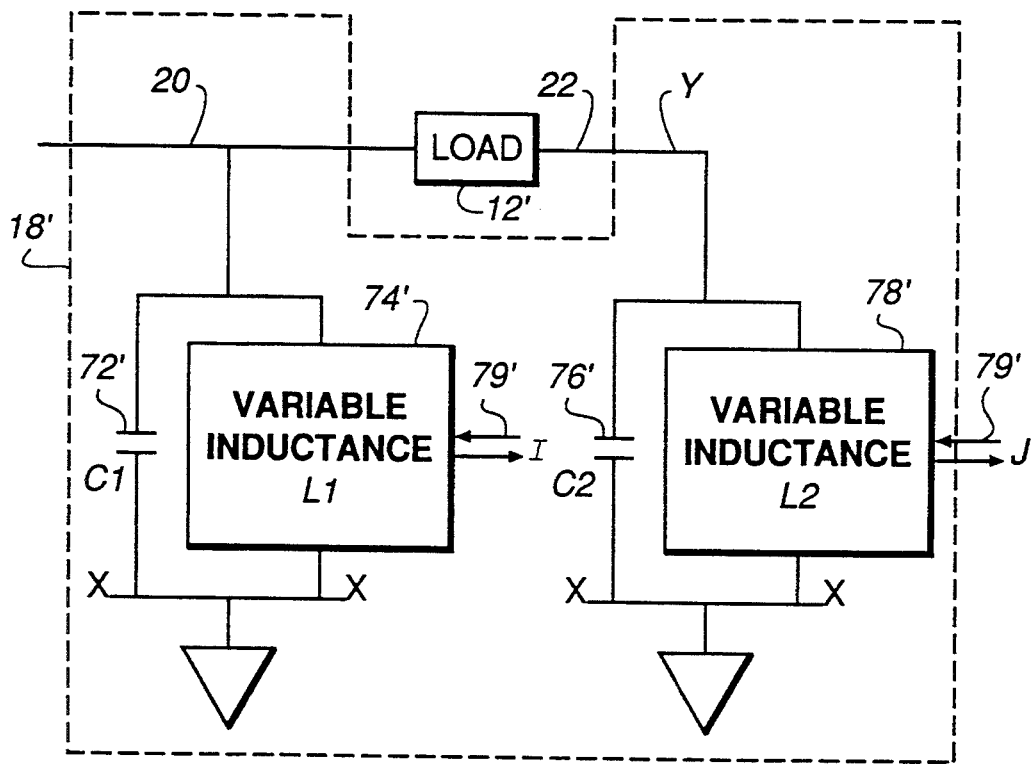

There are two important configurations of the matching network and the manner in which the load is connected to the network, one which is preferred when the load impedance must be referred to ground and the other which is preferred when the load may be floated with respect to ground. The two configurations are shown in FIGS. 3 and 4, respectively. In FIG. 3, the network is in a pi configuration, including a fixed series inductor 70 and two shunt circuits, one on each side of the fixed inductor. In some applications, element 70 may be a fixed capacitance, rather than an inductance. The first shunt circuit, in parallel with the generator (not shown in FIG. 3) has a fixed capacitor 72 and a variable inductor 74 connected in parallel. The other shunt circuit, in parallel with the load 12, has fixed capacitor 76 and a variable inductor 78 connected in parallel. Each of the variable inductors 74 and 78 has control inputs 79 for input of dc control currents, indicated as I and J. The load 12 might include, for example, a bias electrode in a plasma chamber. A return path will be provided through walls of the chamber, or through some other electrode, and the nature of the impedance will be predominantly capacitive, with a resistive power dissipating component.

Each of the shunt circuits, such as 72, 74 is electrically equivalent to a capacitor or an inductor; when the impedance matching network 18 is operated at a frequency above the resonant frequency $1/\sqrt{L_1 C_1}$, the shunt circuit behaves as a capacitor, below the resonant frequency, the shunt circuit behaves as an inductor. The variable inductor value is designed to provide an adjustment range of approximately 30–40 percent of the inductor's nominal value. For example, an inductor having a nominal inductance value of 10 $\mu$H (microhenries) might be made adjustable down to a value of approximately 6.5 $\mu$H.

The X symbols in the diagram represent current transformers, by means of which current measurements are taken in each circuit branch in which an impedance is connected. Voltage is measured at the output of the network, as indicated at Y, and the network input voltage is already known from forward and reflected voltage measurements taken at the input. Specifically, the input voltage is the algebraic sum of the forward and reflected voltages. From these current and voltage measurements, the actual impedance values can be calculated for each of the impedances in the network. These calculated values are used to make corrections to the network model at each iteration of the control process.

The circuit of FIG. 4 differs in that the load 12' is positioned in the series-connected position of the fixed inductance 70 of the FIG. 6 configuration. The network 18' includes fixed capacitors 72' and 76' and variable inductors 74', and 78' connected in much the same manner as in FIG. 6. However, the circuit 18' has its output nodes connected to lines 20 and 22, instead of between line 22 and ground. Accordingly, although the two configurations are outwardly similar, different network models are needed for the two configurations. As in FIG. 3, the symbols X and Y indicate locations at which measurements of current and voltage, respectively, are taken.

In FIGS. 3 and 4, the shunt circuits comprise a variable inductance in parallel with a fixed capacitance. This is the preferred configuration because it allows one end of both the capacitor and inductor to be connected to ground. However, a series configuration could also be used to similar effect, although the behavior of the series combination would be the opposite of the parallel combination: the series combination would behave as a capacitor below the resonant frequency and an inductor above the resonant frequency.

FIG. 5 is a diagrammatic depiction of one of the variable inductors used in the matching network of the presently preferred embodiment of the invention. The inductor consists of a cylindrical core 80 of soft ferrite material, or ferromagnetic or antiferromagnetic material, on which is wound an inductive coil 82, having terminals 84 for connection to the matching network 18 or 18'. The coil 82 is positioned near the center of the core 80. Near the ends of the core 80 are two control windings 86 and 88, through which dc control currents supplied by a control means 81 are applied through the terminals 79. The control windings 86 and 88 are shown as being connected in parallel, but may also be designed to be connected in series. An essential requirement is that the current applied to the two coils 86 and 88 should produce aiding magnetic fields, i.e. in the same direction in the core 80. Varying the direct current applied to the control windings 86 and 88 varies the inductance value seen at the terminals 84 of the inductive coil 82.

The design of the variable inductance depicted in FIG. 5 has the advantage that it is easier to manufacture than coils of toroidal configuration. Moreover, the right-cylindrical design lends itself to liquid cooling by simply enclosing the core in a cooling jacket through which a liquid, such as deionized water, can be circulated. The windings may also be cooled, if necessary, by passing fluid through hollow conductors forming the windings, or by other means. An important aspect of the variable inductor design is that care must be taken to inhibit transformer action in which alternating current from the inductive coil 82 might be induced in the dc control windings 86 and 88. Transformer action can be minimized by a combination of electrostatic shielding of the control windings and appropriate filtering in the circuit supplying the control windings, and by physical separation of the control windings from the inductive coil.

One specific design which meets these requirements is illustrated in FIGS. 6A, 6B and 6C. Core 80 is 7½ inches high by ¾ inch in diameter, and is suspended in a cavity filled with cooling water or other liquid. The cooling water cavity is defined by endpieces 90 (which have a top-hat shape, as illustrated in FIG. 6C) and a casting 92 (which has a cylindrical shape). The cooling water flows through the cavity in the direction indicated at 93° The core is suspended in the center of the cavity by plastic spiders 94 positioned between the ends of the core and the endpieces 90.

Inductive coil 82 and control windings 86 and 88 are encased in alumina-filled epoxy castings. The control windings 86, 88 each contain approximately 100 turns and are formed into a toroidal shape having a 1 by 1 inch square cross-section. Taps 79 emerge from each end of each control winding and can be connecting to a suitable driving current source. The coil 82 contains 5–7 turns, and is approximately half as long as rod 80, or about 3¾ inches long. The diameter of the coil 82 is as close as possible to that of the core 80, e.g. about 1 inch, to minimize leakage flux which would reduce the range of adjustment of the permeability ($\mu$) of the core 80 and thus therefore the adjustment range of the inductance of the coil 82. One end of coil 82 contains a single tap 84 which is connected to ground; the other end of coil 82 contains three different taps—the inductance range of the coil 82 is chosen by attaching node 20 or 22 (FIG. 3, 4) to the appropriate one of these three taps.

In one application, the core material is a ceramic ferrite rod manufactured by National Magnetics. This rod has a $\mu_r$ of 125 at H=0 (the effective $\mu$ at H=0 of the coil described above using 5–7 turns, due to the open magnetic path, is approximately 10; the effective $\mu$ drops to approximately 5 as H becomes large). Using this core, the inductance of a 6 turn coil operating at 1.8–2 MHz, with zero control winding current, is approximately 4 $\mu$H; at 30 Amps of control winding current, the inductance reduces to approximately 2 $\mu$H.

One advantage of the FIG. 6A design is that it provides for effective cooling. The control winding castings are formed so as to fit tightly to and in thermal contact with the endpieces 90. Furthermore, the alumina-filled epoxy casts, and the endpieces 90, are manufactured of materials with high heat conductivities and low heat capacities, so that the flow of cooling water cools not only the core but also the coil and control windings.

Another advantage of the FIG. 6A design is that it electro-magnetically decouples the control windings 86 and 88 from the coil 82. If endpieces 90 are made of a conductive material (e.g., metal), they will serve as Faraday shields which buck substantially all of the high-frequency magnetic fields emitted by coil 82, preventing these magnetic fields from coupling to the control windings 86 and 88 and creating high-frequency transformer effects between coil 82 and control windings 86 and 88. However, low frequency magnetic fields such as those emitted by control windings 86 and 88 are substantially unaffected by the endpieces 90 (because the endpieces are not perfect conductors), and as a result these low frequency magnetic fields penetrate through the core 80 and thereby change the permeability of the core and the inductance of coil 82.

Another advantage of the FIG. 6A design is low loss. Networks which use the FIG. 6A design have demonstrated efficiencies of approximately 95%. This efficiency is achieved by minimizing each of the potential sources of loss (e.g., eddy currents, hysteresis, and resistance losses), in the manner discussed below.

Because core 80 is manufactured of a ceramic magnetic material which has low conductivity eddy current losses in the core are minimized. To avoid losses outside of the core, deionized water can be used and a non-conductive epoxy is used to encase the coil and control windings in castings. To prevent high-frequency eddy currents in the conductive endpieces 90, the endpieces contain a small gap 96 as shown in FIG. 6C, so that there is no continuous conductive path around the endpiece. (A negligible amount of high-frequency magnetic field penetrates gap 96.)

High-frequency hysteresis losses in the core 80 are also reduced by this design. The primary design feature is the fact that core 80 is "gapped", that is magnetic field (H) lines generated by the coil 82 must travel outside of the core 80.

Figure 9:
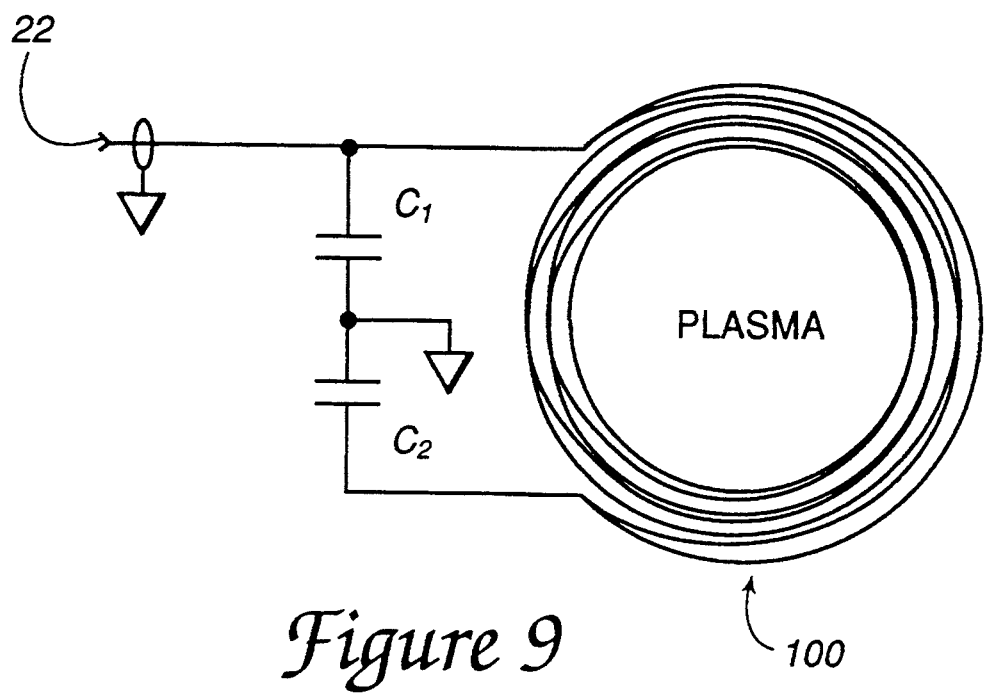
FIG. 9 is a diagrammatic view of the RF inductive antenna wound around the processing chamber of FIG. 7, and impedance matching capacitors. DESCRIPTION OF THE PREFERRED EMBODIMENT(S)

To further minimize hysteresis losses, the core 80 is manufactured from a ferrite having a low loss tangent. The low frequency excitation level of the core is kept at a minimum by selecting values for $L_1$, $L_2$, $L_3$, $C_1$ and $C_2$ which place the desired impedance near the center of the tunable range, thus reducing the control current amplitudes. (The relationship of the L and C values to the tunable range is discussed below with reference to FIGS. 8A and 8B.) The excitation level can also be reduced by a local matching circuit (discussed below with reference to FIG. 9) which translates the impedance of the load into a region in which it can be more easily matched.

Resistance losses are minimized by using large conductor wires and by cooling the windings and coil to a temperature near to the manufacturer's specifications, thereby preventing runaway.

Figure 7:
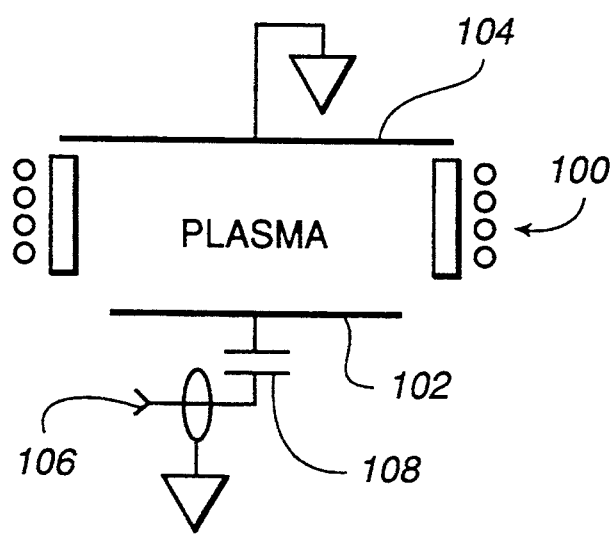
FIG. 7 is a diagrammatic cross-sectional view of a plasma processing chamber used in a particular embodiment of the invention.

In an important application of the invention, the electrical load is a plasma process. Referring to FIG. 7, in a particular plasma process described in previously-filed copending U.S. patent application Ser. No. 722,340, power is coupled to the process by two different means. Source power for the process is inductively coupled via an inductive antenna into a process chamber, and bias power for the same plasma process is applied through a bias electrode 102 in the chamber. (Electrode 104 is grounded, and electrode 102 is driven by RF power from transmission line input 106 via high-capacitance coupling capacitor 108, which can be ignored for purposes of the RF design.)

In accordance with one aspect of the invention, a matching network is used for each of these loads. (Impedance matching of the bias load is not initiated until the principal, inductively coupled, load is impedance-matched to a desired degree.)

Another important aspect of the invention is to provide for plasma initiation. Plasma initiation requires that a sufficient electric field magnitude be developed within the gas in the plasma chamber.

Previously filed copending application Ser. No. 07/825,658 describes control techniques for fine tuning the impedance matching circuits of FIGS. 3 and 4 during plasma initiation and maintaining this tuning during the subsequent steady-state plasma process.

To achieve optimal control and matching of these circuits, the designer must first select the appropriate initial element values for the fixed and variable capacitance and inductance values in the matching network. The appropriate procedure is exemplified by the following discussion with reference to the circuit of FIG. 3.

In the following, the maximum values of variable inductances 74 and 78 are referred to as $L_1$ and $L_2$, respectively. Fixed inductance 70 is referred to as $L_3$. Capacitors 72 and 76 are referred to as $C_1$ and $C_2$, respectively. The network is controlled by adjusting the variable inductance elements 74 and 76; the control variables are multipliers $\alpha_1$ and $\alpha_2$, whose values lie between 0 and 1. In operation, the effective inductances of elements 74 and 78 are $\alpha_1 L_1$ and $\alpha_2 L_2$, thus the multipliers $\alpha_1$ and $\alpha_2$ represent the effective inductances of elements 74 and 76 as a fraction of their maximum inductances $L_1$ and $L_2$, respectively.

As noted above, when the circuit of FIG. 3 is properly matched to the load impedance $Z_L$, the output impedance $Z_{OUT}$ seen by the load 12 is the complex conjugate of the load impedance $Z_L$. Thus, the first step in selecting values for $L_1$, $C_1$, $L_2$, $C_2$ and $L_3$ is to form an expression for the complex conjugate of the output impedance $Z_{OUT}$ of the circuit of FIG. 3 in terms of the values of the circuit element impedances and the impedance of the generator $Z_G$ 16 (FIG. 2).

Figure 8A:
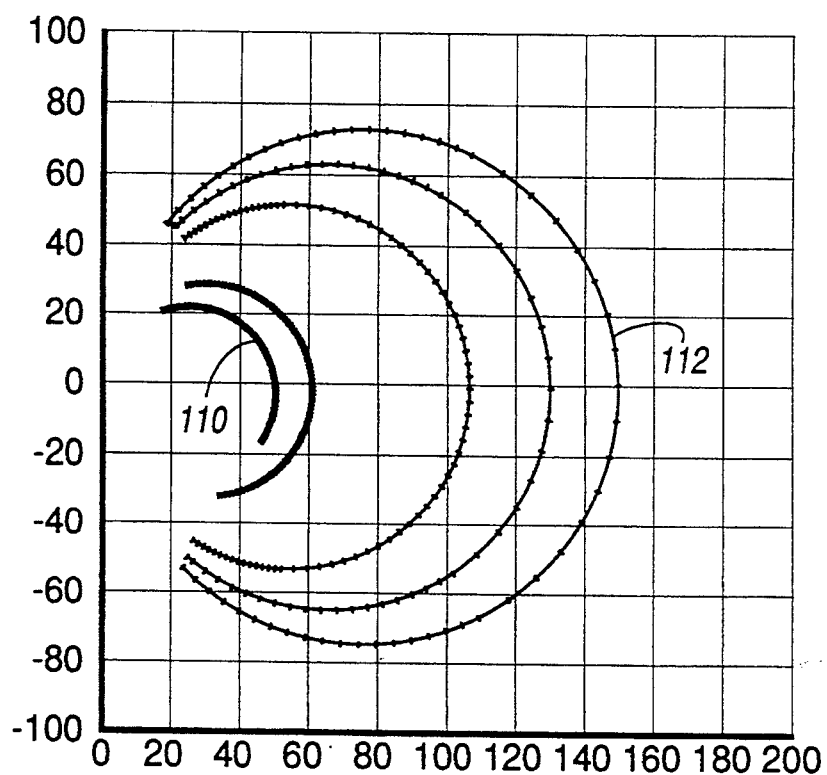
FIGS. 8A and 8B are graphs of the output impedance of the matching network of FIG. 3 showing the range of output impedances available by varying the inductance values of $L_1$ and $L_2$.
Figure 8B:
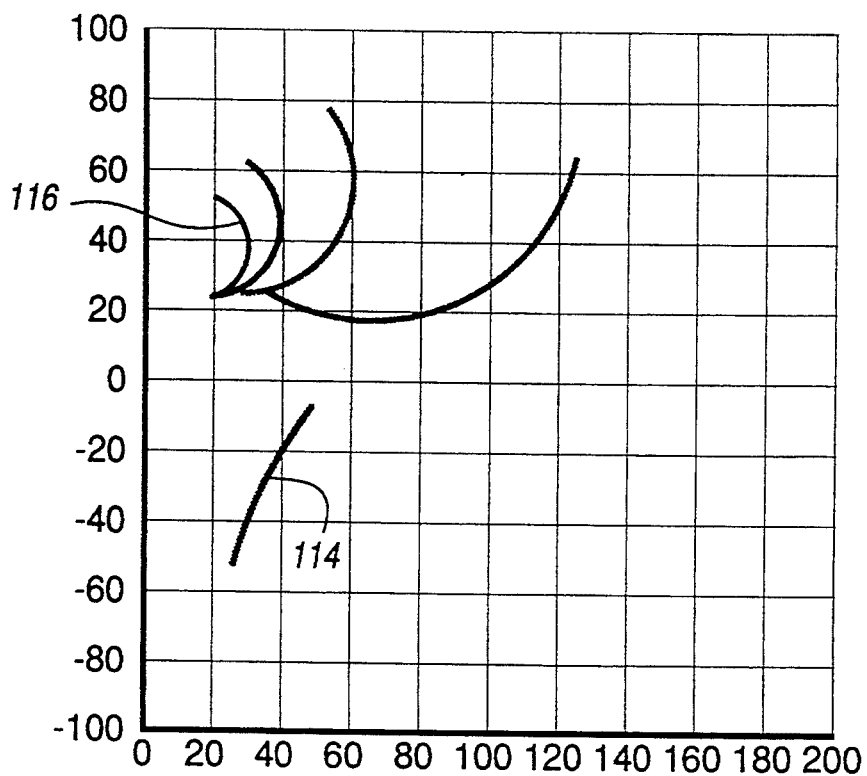

The tuning space that results from varying the values of $L_1$ and $L_2$ while keeping $C_1$ and $C_2$ and $L_3$ fixed is shown in FIGS. 8A and 8B. These figures show the region in the complex plane over which the load may vary and still be matchable to the desired generator impedance. The relationship is given by the following equation:

$$Z_L = \left[\left[\left[\frac{1}{Z_G} - \left[\frac{1}{s \cdot \alpha_1 \cdot L_1} + s \cdot C_1\right]\right]^{-1} - s \cdot L_3\right]^{-1} - \left[\frac{1}{s \cdot \alpha_2 \cdot L_2} + s \cdot C_2\right]\right]^{-1} \quad (1)$$

where $s = j\omega$ and $j = \sqrt{-1}$.

FIG. 8A illustrates the curves generated by varying $\alpha_2$ while $\alpha_1$ is maintained at constant values. Each of these curves of constant $\alpha_1$ is a circle whose center lies on the real axis, and which contains the origin $(0+j0)$. Not all of the circle is contained in the tuning range due to the limited range of $\alpha_2$. The diameter of each circle depends on the value chosen for $\alpha_1$ and the values of the fixed components $C_1$, $C_2$ and $L_3$.

FIG. 8B illustrates the curves generated by varying $\alpha_1$ while $\alpha_2$ is maintained at a constant value. Each of the curves of constant $\alpha_2$ is also a circle, but these are offset; each is tangent to the innermost of the circles of constant $\alpha_1$ (110) and also tangent to the imaginary axis. The diameter of each of these circles depends on the value of $\alpha_2$ and the values of the fixed components $C_1$, $C_2$, and $L_3$.

Figure 8C:
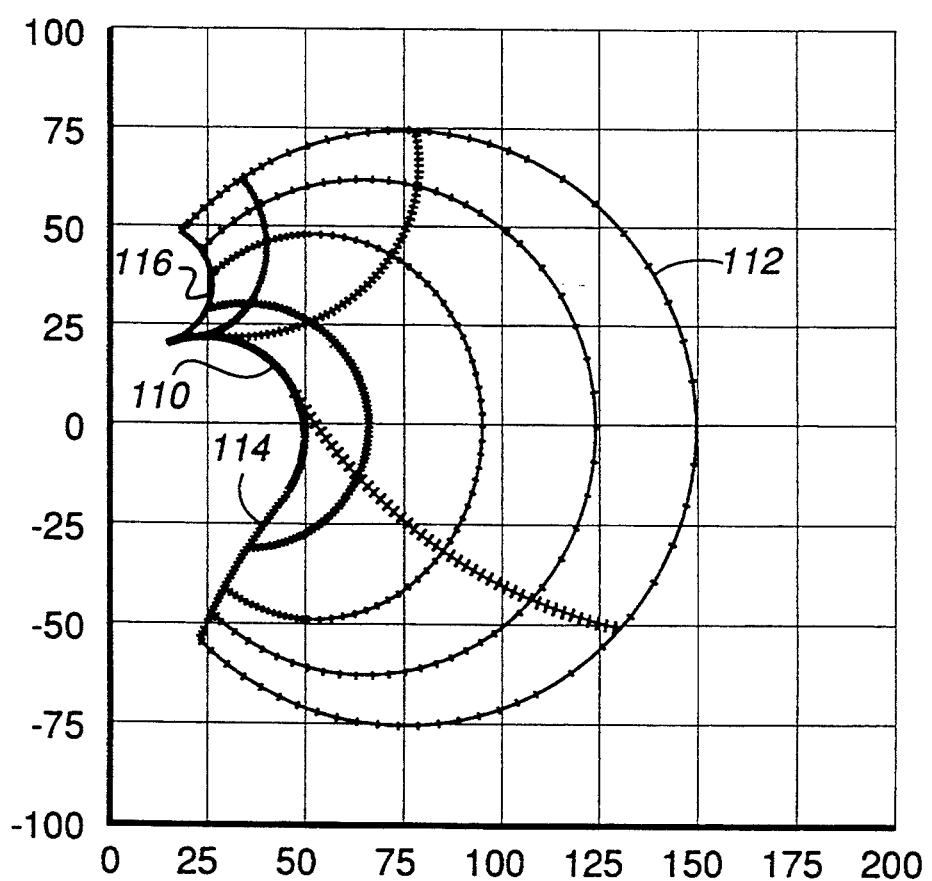
FIG. 8C is a graph of FIG. 8A superimposed on FIG. 8B.

FIG. 8C shows the curves of FIGS. 8A and 8B superimposed to show the relationships described above.

The procedure for selecting appropriate values for $L_1$, $C_1$, $L_2$, $C_2$, and $L_3$ that allows for a particular range of load impedance to be matched to a desired generator impedance is as follows:

First, the designer chooses the operating frequency $\omega$. Then the inner limit circle (curve 110) is specified by its real intercept $\rho_1$. No load impedance lying inside this circle can be matched to the target generator impedance by the network. $L_3$ is then provided by the following equation:

$$L_3 = \frac{1}{\omega} \cdot \sqrt{\frac{|Z_G|^2}{\Re(Z_G)} \cdot \rho_1} \qquad (2)$$

where $\Re$ indicates the real-part operation

After computing $L_3$, the designer then specifies the outer limit circle (curve 112) by its real intercept. This value is referred to as $\rho_2$. The desired values for $L_1$ and $C_1$ can then be determined by first computing the range for the parallel combination of $L_1$ and $C_1$, denoted as $Z_1$. $Z_1$ is defined as $[(1/\omega L_1) - \omega C_1]^{-1}$. The range of $Z_1$ is as follows:

$$\frac{1}{Z_{1,MIN}} = \frac{\Re(Z_G)}{|Z_G|^2} - \frac{1}{\omega L_3} \qquad (3)$$

$$\frac{1}{Z_{1,MAX}} = \frac{\Re(Z_G)}{|Z_G|^2} - \frac{1}{\omega L_3} \left[ 1 + \frac{\rho_2 \Re(Z_G)}{|Z_G|^2} \sqrt{\frac{|Z_G|^2}{\Re(Z_G)\rho_2} - \left(\frac{\omega L_3}{\rho_2}\right)^2} \right]$$

This yields a pair of simultaneous equations for $L_1$ and $C_1$:

$$\frac{1}{Z_{1,MIN}} = \frac{1}{\omega \alpha_{1,MIN} L_1} - \omega C_1 \qquad (4)$$

$$\frac{1}{Z_{1,MAX}} = \frac{1}{\omega L_1} - \omega C_1$$

Specifying the minimum value for $\alpha_1$ ($\alpha_{1,MIN}$) allows these equations to be solved for $L_1$ and $C_1$.

These equations generate values for $L_1$ and $C_1$ such that the innermost curve (110) of FIG. 8A corresponds to the minimum value for $L_1$ ($\alpha_1 = 0.5$ in the following example) and the outermost curve (112) corresponds to $\alpha_1 = 1$. This ordering can be inverted by choosing a slightly different set of equations for $1/Z_{1,MIN}$ and $1/Z_{1,MAX}$:

$$\frac{1}{Z_{1,MIN}} = \frac{\Re(Z_G)}{|Z_G|^2} - \frac{1}{\omega L_3} \qquad (5)$$

$$\frac{1}{Z_{1,MAX}} = \frac{\Re(Z_G)}{|Z_G|^2} - \frac{1}{\omega L_3} \left[ 1 - \frac{\rho_2 \Re(Z_G)}{|Z_G|^2} \sqrt{\frac{|Z_G|^2}{\Re(Z_G)\rho_2} - \left(\frac{\omega L_3}{\rho_2}\right)^2} \right]$$

(Reversing the ordering in this manner also affects the values for $L_2$ and $C_2$ since the curvature of the curves of constant $\alpha_2$ would be reversed.) For the examples given here the solution provided by equations 3 are preferred.

After computing values for $L_3$, $C_1$, $L_1$ and $\alpha_{1,MIN}$, the designer can then compute values for $L_2$ and $C_2$ by deciding upon the desired shape of the arcs of FIG. 8B. The locations of the centers of curvature of these arcs are related to the values of $L_2$ and $C_2$; therefore, by choosing the desired center of curvature for two of the arcs, the designer can determine the desired values for $L_2$ and $C_2$.

The limiting curves 114 and 116 can be specified by the real parts of their centers. The real component of the center of arc 114 be referred to as $\rho_3$ and the real component of the center of arc 116 will be referred to as $\rho_4$. $\rho_3$ and $\rho_4$ are related to $L_2$ and $C_2$ by the following equations:

$$\frac{1}{Z_{2,MIN}} = \frac{1}{\omega L_3} \left[ \sqrt{\frac{|Z_G|^2}{\Re(Z_G)\rho_3}} - 1 \right] \qquad (6)$$

$$\frac{1}{Z_{2,MAX}} = \frac{-1}{\omega L_3} \left[ \sqrt{\frac{|Z_G|^2}{\Re(Z_G)\rho_4}} + 1 \right]$$

where $Z_2$ is defined as $[(1/\omega L_2) - \omega C_2]^{-1}$. $C_2$ and $L_2$ can be found by computing the range limits for $Z_2$ from these equations and then solving simultaneous equations (analogous to equations (5)) relating $Z_2$ to $L_2$, $C_2$, and $\alpha_{2,MIN}$.

The graphs of FIGS. 8A and 8B were generated for the circuit of FIG. 3 as configured to allow matching with the source antenna 100 of the plasma process illustrated in FIG. 7. In this application, the operating frequency $f = 2$ MHz, (so that the angular frequency $\omega = 2\pi \cdot 2.0 \cdot 10^6$ radians/second), and the generator impedance $Z_G = 50\Omega$. The minimum real axis intercept was chosen at $\rho_1 = 50\Omega$, so that $L_3 = 3.98$ $\mu$H. The maximum real axis intercept was chosen at $\rho_2 = 150\Omega$, and $\alpha_{1,MIN} = 0.5$, so that $L_1 = 2.81$ $\mu$H, $C_1 = 6.09$ nF. The centers of arcs 114 and 116 were chosen at $\rho_3 = 250\Omega$ and $\rho_4 = 14\Omega$, and $\alpha_{2MIN} = 0.5$, so that $L_2 = 2.41$ $\mu$H, $C_2 = 6.35$ nF.

In another application, the circuit of FIG. 3 may be configured to allow matching the driving impedance of the bias electrode 102 of FIG. 7. In this application, the operating frequency $f = 1.8$ MHz, (so that the angular frequency $\omega = 2\pi \cdot 2.0 \cdot 10^6$ radians/second), and the generator impedance $Z_G = 50\Omega$. The minimum real axis intercept was chosen at $\rho_1 = 20\Omega$, so that $L_3 = 2.80$ $\mu$H. The maximum real axis intercept was chosen at $\rho_2 = 120\Omega$, and $\alpha_{1MIN} = 0.5$, so that $L_1 = 1.98$ $\mu$H, $C_1 = 10.7$ nF. The centers of arcs 114 and 116 were chosen at $\rho_3 = 250\Omega$ and $\rho_4 = 14\Omega$, and $\alpha_{2MIN} = 0.5$, so that $L_2 = 1.69$ $\mu$H, $C_2 = 11.2$ nF.

A plasma loaded inductive antenna has a complex impedance with a relatively large positive imaginary part and a relatively small real part. If such an impedance were plotted in FIGS. 8A, 8B, or 8C, it would lie well above the upper left corner of the graphs. To use the matching network of FIG. 3 for this type of inductive plasma source, it is useful to transform the impedance of the antenna to one lying within the tuning range by a network such as that shown in FIG. 9.

A designer can compute values for $C_1$ and $C_2$ which will achieve a desired impedance $Z_e$ at input line 22 by measuring of the impedance, $Z_p$, of the source antenna coil 100 and the plasma loading it, and then applying the following formulas:

$$C_1 = \frac{1}{\omega}\left[-\frac{(Z_e)}{|Z_e|^2} + \frac{\sqrt{(Z_p)\left[\frac{|Z_e|^2}{(Z_e)} - (Z_p)\right]}}{(Z_p)\frac{|Z_e|^2}{(Z_e)}}\right] \quad (7)$$

$$C_2 = \frac{1}{\omega\left[(Z_p) - \sqrt{(Z_p)\left[\frac{|Z_e|^2}{(Z_e)} - (Z_p)\right]}\right]}$$

In one application, the source antenna coil has a radius r of 6½ inches and a height h of 1¾ inches and includes T=7¼ turns. The unloaded impedance of a source antenna coil 100 of this type has been empirically measured at 17 μH (which compares favorably to a theoretical value of 14.6 μH computed by the rule-of thumb formula L=½·10$^{-6}$·T$^2$r$^2$/[9r+10h].) The impedance of a plasma contained in a chamber such as illustrated in FIG. 7, not including the source antenna coil 100, has been empirically measured at 12−j10. Thus, the plasma and antenna impedance, which will be referred to as $Z_p$, is equal to 12+j($\omega L_a$−10). Assuming a target impedance of $Z_e$=25−j25, and an operating frequency f=2.0 MHz (so $\omega$=2·$\pi$·2·10$^6$), the values produced by equations 8 are $C_1$=4.42 nF and $C_2$=437 pF.

It will be appreciated from the foregoing that the present invention represents a significant advance in the field of dynamic impedance matching networks, to maximize the power transferred to the load. In particular, the invention provides a reliable technique for matching a source impedance with a variable and unknown load impedance. It will also be appreciated that, although a specific embodiment of the invention has been described in detail by way of illustration, various modifications may be made without departing from the spirit and scope of the invention. Accordingly, the invention is not to be limited except as by the appended claims.

What is claimed is:

1. A variable inductance element for generating an inductive reactance to a high-frequency electrical signal current flowing between a first and a second signal terminal, comprising a rod-type core manufactured of a material having a non-linear relationship between magnetic field intensity H and magnetic flux density B, control means for generating a low-frequency electrical control current, a first control winding bearing said control current and generating magnetic fields in said core, and a signal coil coupled between said first and second signal terminals bearing said high-frequency electrical signal current and generating magnetic fields in said core.

2. The variable inductance element of claim 1 wherein said core is a cylindrical rod.

3. The variable inductance element of claim 2 further comprising a second control winding for bearing a low-frequency electrical control current generating magnetic fields in said core in substantially the same direction as said first winding, wherein said coil is wound around a midsection of said rod and said first and second control windings are positioned on said rod on opposite sides of said coil.

4. The variable inductance element of claim 3 wherein said rod is suspended inside of said first and second winding and said coil such that there is a cylindrical cavity between said core and said windings and coil, and further comprising cooling liquid in said cylindrical cavity between said core and said windings and coil in thermal contact with said core, windings and coil.

5. The variable inductance element of claim 4 wherein said cooling liquid flows through cavity along the length of said rod.

6. The variable inductance element of claim 3 further comprising conductive shielding positioned between said control windings and said core and between said control windings and said coil for preventing high-frequency magnetic fields generated by said coil from coupling through said control windings, but permitting low-frequency magnetic fields generated by said control windings to couple through said coil.

7. The variable inductance element of claim 6 wherein said conductive shielding possesses a gap to prevent high frequency eddy currents.

* * * * *